(12) United States Patent
Cao et al.

(10) Patent No.: US 12,155,175 B2
(45) Date of Patent: Nov. 26, 2024

(54) LASER WITH HEXAGONAL SEMICONDUCTOR MICRODISK

(71) Applicant: SOOCHOW UNIVERSITY, Suzhou (CN)

(72) Inventors: Bing Cao, Suzhou (CN); Geng He, Suzhou (CN); Qinhua Wang, Suzhou (CN); Xianjie Xiong, Suzhou (CN); Zhihao Yuan, Suzhou (CN); Hao Zhou, Suzhou (CN); Anlin Luo, Suzhou (CN); Wangyibo Chen, Suzhou (CN); Liyue Xu, Suzhou (CN)

(73) Assignee: SOOCHOW UNIVERSITY, Suzhou (CN)

( * ) Notice: Subject to any disclaimer, the term of this patent is extended or adjusted under 35 U.S.C. 154(b) by 616 days.

(21) Appl. No.: 17/440,776

(22) PCT Filed: Sep. 30, 2020

(86) PCT No.: PCT/CN2020/119181
§ 371 (c)(1),
(2) Date: Sep. 19, 2021

(87) PCT Pub. No.: WO2021/155672
PCT Pub. Date: Aug. 12, 2021

(65) Prior Publication Data
US 2022/0181849 A1   Jun. 9, 2022

(30) Foreign Application Priority Data
Feb. 3, 2020 (CN) .......................... 202010079229.4

(51) Int. Cl.
*H01S 5/10* (2021.01)
*H01S 5/028* (2006.01)
(Continued)

(52) U.S. Cl.
CPC ............ *H01S 5/1075* (2013.01); *H01S 5/028* (2013.01); *H01S 5/041* (2013.01); *H01S 5/1042* (2013.01);
(Continued)

(58) Field of Classification Search
CPC ........ H01S 5/1075; H01S 5/028; H01S 5/041; H01S 5/1042; H01S 5/125; H01S 5/20; H01S 5/30; H01S 5/343
See application file for complete search history.

(56) References Cited

U.S. PATENT DOCUMENTS

| 6,577,661 B1* | 6/2003 | Wang ................... H01S 5/1071 372/45.01 |
| 2014/0353712 A1* | 12/2014 | Chang-Hasnain ...... H01L 33/24 438/39 |
| 2017/0047707 A1* | 2/2017 | Hamilton ............ H01S 5/02484 |

FOREIGN PATENT DOCUMENTS

| CN | 101325311 A | 12/2008 |
| CN | 101867147 A | 10/2010 |

(Continued)

OTHER PUBLICATIONS

Yang et al. ("Whispering-gallery mode hexagonal micro-/nanocavity lasers," Photonics Research, vol. 7, No. 5, May 2019) (Year: 2019).*

*Primary Examiner* — Yuanda Zhang
(74) *Attorney, Agent, or Firm* — SZDC Law PC

(57) ABSTRACT

A laser with a hexagonal semiconductor microdisk to solve the problems of a low quality factor of a hexagonal whispering-gallery mode and light exiting difficulty of a triangular whispering-gallery mode is disclosed. Based on physical characteristics of stimulated radiation of gain materials with a high refractive index, the apparatus uses a distributed Bragg reflection layer to reduce an optical loss of a microcavity laser, and uses a hexagonal semiconductor microdisk (Continued)

as an optical resonator and laser gain material. As an optical pump source, the laser provides an optical gain, and when the gain exceeds a microcavity laser threshold, generates laser light for exiting. By controlling a laser spot of the pump source to be located at a corner of the hexagonal microdisk, the laser light in a double-triangular whispering-gallery optical resonance mode is generated after stimulated radiation for exiting.

4 Claims, 6 Drawing Sheets

(51) Int. Cl.
    *H01S 5/04*     (2006.01)
    *H01S 5/125*     (2006.01)
    *H01S 5/20*     (2006.01)
    *H01S 5/30*     (2006.01)
    *H01S 5/343*     (2006.01)

(52) U.S. Cl.
    CPC ................ *H01S 5/125* (2013.01); *H01S 5/20* (2013.01); *H01S 5/30* (2013.01); *H01S 5/343* (2013.01)

(56) References Cited

FOREIGN PATENT DOCUMENTS

| | | |
|---|---|---|
| CN | 102148476 A | 8/2011 |
| CN | 106129808 A | 11/2016 |
| CN | 111162453 A | 5/2020 |
| CN | 211045977 U | 7/2020 |
| JP | 2008065317 A | 3/2008 |

\* cited by examiner

LASER WITH HEXAGONAL SEMICONDUCTOR MICRODISK

This application is the National Stage Application of PCT/CN2020/119181, filed on Sep. 30, 2020, which claims priority to Chinese Patent Application No. 202010079229.4, filed on Feb. 3, 2020, which is incorporated by reference for all purposes as if fully set forth herein.

TECHNICAL FIELD

The present invention relates to the field of semiconductor microcavity lasers, and in particular, to a laser with a hexagonal semiconductor microdisk.

BACKGROUND

Semiconductor materials have high application values in the fields of micro-nano light-emitting devices and photoelectric integration and therefore have attracted wide attention from scientists. Especially, semiconductors with a high refractive index and a direct band gap, such as GaN, ZnO, GaAs, InP, and perovskite, can be directly used as gain materials and resonators to prepare microcavity lasers. In addition, detectors and light-emitting devices made from compounds such as GaInN, AlGaN, and GaInAs can further cover wide bands of ultraviolet, visible light and near infrared. A whispering-gallery mode microcavity laser has been widely studied because it complies with the principle that light is totally reflected on a dielectric surface to form periodic resonance. Compared with Fabry-Perot mode, this mode has the advantages of a small size, a high quality factor, a low threshold, ease of integration, etc. Whispering-gallery mode microcavity lasers based on semiconductor materials can be used in optical communication, optical storage, chemical and biological detection and other fields.

Currently reported semiconductor whispering-gallery mode microcavity lasers under research mainly use a microdisk structure, where a hexagonal microdisk is widely studied. This is because most semiconductors with a wide band gap and a direct band gap have a wurtzite structure, and therefore the microdisk obtained by epitaxial growth has a hexagonal prism geometry. In addition, in the study of optical modes of a hexagonal resonator, reported modes are mostly hexagonal and triangular whispering-gallery modes, e.g., a hexagonal whispering-gallery mode solution (see [Rui Chen and Bo Ling, "Room Temperature Excitonic Whispering Gallery Mode Lasing from High-Quality Hexagonal ZnO Microdisks", *Advanced Materials*, vol. 23, no. 19, pp. 2199+, 2011]) and a triangular whispering-gallery mode solution (see [Kouno T, "Lasing Action on Whispering Gallery Mode of Self-Organized GaN Hexagonal Microdisk Crystal Fabricated by RF-Plasma-Assisted Molecular Beam Epitaxy", *IEEE Journal of Quantum Electronics*, vol. 47, no. 12, pp. 1565-1570, 2011]). According to the theoretical research by Wiersig, J. (see ["Hexagonal dielectric resonators and microcrystal lasers", *Physical Review A*, vol. 67, no. 2, pp. 12, 2003]), a hexagonal whispering-gallery mode optical path is located at the edge of a resonator, and the light can be emergent from a corner due to the optical diffraction principle, but its quality factor is much lower than that of the triangular whispering-gallery mode. In addition, a reflection area of light in the triangular whispering-gallery mode is located at the center of each side of a hexagon, which makes it difficult for internally circulating light to exit, hence reducing luminous efficiency of the laser. Therefore, the two problems degrade the performance of a laser with a hexagonal semiconductor microdisk.

SUMMARY

In view of this, a main objective of the present invention is to provide a laser with a hexagonal semiconductor microdisk, to overcome the shortcomings in existing solutions that a hexagonal whispering-gallery mode has a low quality factor and a triangular whispering-gallery mode has difficulty in exiting light. The laser with a hexagonal semiconductor microdisk has the advantages of a high quality factor and ease of light exiting.

To achieve the above objective, the present invention provides a laser with a hexagonal semiconductor microdisk. The laser with a hexagonal semiconductor microdisk outputs laser light in a double-triangular whispering-gallery mode. The laser with a hexagonal semiconductor microdisk includes a reflecting substrate, a hexagonal semiconductor microdisk, and a laser, where the hexagonal semiconductor microdisk is arranged on the reflecting substrate; emergent light of the laser is perpendicular to a surface of the hexagonal semiconductor microdisk and irradiates any one of six corners of the hexagonal semiconductor microdisk; side walls of the hexagonal semiconductor microdisk are flat, one of the side walls is a front cavity, and the other five side walls are rear cavities; surfaces of the rear cavities are provided with distributed Bragg reflection layers, and laser light in a double-triangular whispering-gallery optical resonance mode exits from the front cavity in the six side walls of the hexagonal semiconductor microdisk.

In a preferred solution, a distributed Bragg reflection layer is also arranged between the hexagonal semiconductor microdisk and the reflecting substrate.

Several layers of quantum well structures are arranged in the hexagonal semiconductor microdisk in a cross-sectional direction.

Further, the quantum well structures include $Ga_XIn_{(1-X)}N$, $Al_XGa_{(1-X)}N$, $Ga_XIn_{(1-X)}As$, and $Al_XGa_{(1-X)}As$, where $X \in (0, 1)$.

With the above-mentioned technical solutions, the present invention has the following beneficial effects: Compared with existing solutions of a laser in a hexagonal whispering-gallery mode and a laser in a triangular whispering-gallery mode, the laser with a hexagonal semiconductor microdisk according to the present invention has the advantages of a high quality factor and ease of light exiting; an interference cavity of the laser with a hexagonal microdisk is formed by the front cavity and the rear cavities composed of the five side walls of the hexagonal microdisk, the light subjected to stimulated radiation oscillates and gains continuously in the interference cavity, and finally, after the laser intensity with the gain exceeds a microcavity laser threshold, the laser generated exits from the front cavity; the arrangement of the distributed Bragg reflection layers on the rear cavities can effectively improve the reflection efficiency of the surfaces, so that the laser light exiting from the front cavity can be effectively enhanced, and in addition, the emergent light is effectively controlled.

Further, inserting the distributed Bragg reflection layer between the hexagonal microdisk and the substrate can effectively prevent the light in the hexagonal microdisk from running down and being lost in the substrate, thereby effectively reducing the optical loss and improving the optical characteristics of the laser.

Further, adding the quantum wells to the hexagonal microdisk can effectively improve the luminous efficiency of the laser, and laser light in any wave band can be emitted based on the properties of the quantum wells.

Figure 1:
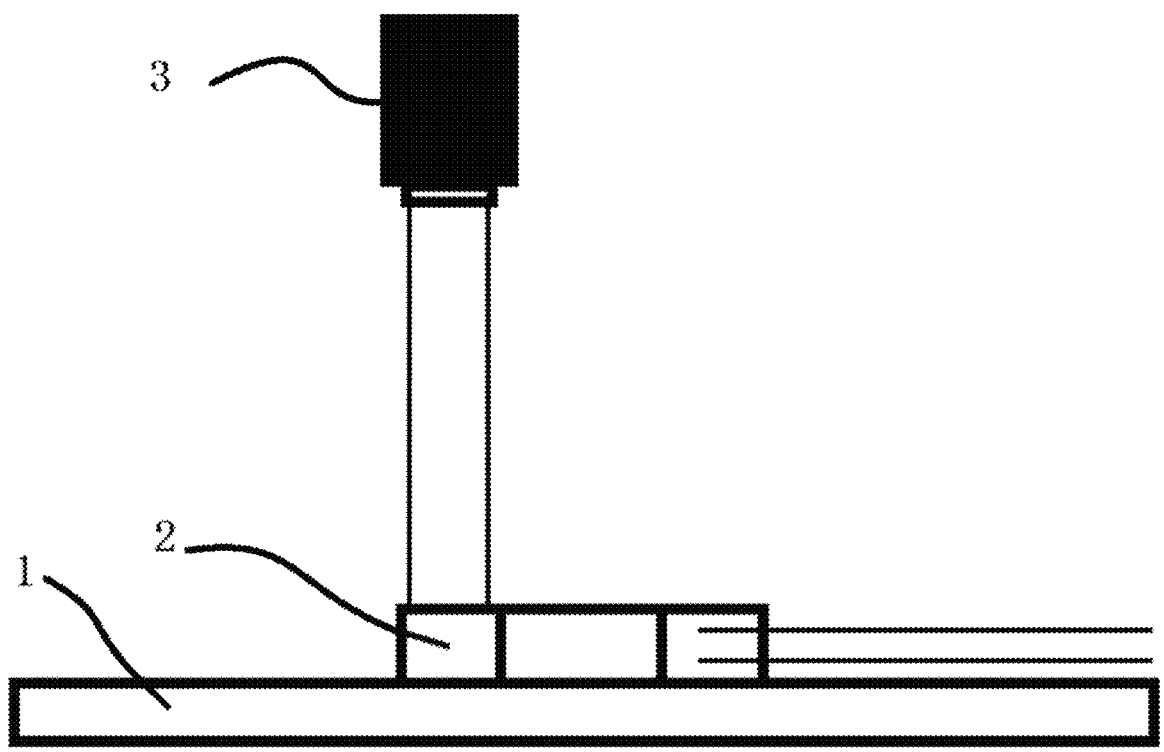
FIG. 1 is a schematic front view of a laser with a hexagonal semiconductor microdisk.

In the drawings: 1: reflecting substrate; 2: hexagonal semiconductor microdisk; 3: laser; H1 to H5: first rear cavity to fifth rear cavity; Q: front cavity; 4: distributed Bragg reflection layer; 5: several layers of quantum well structures.

DESCRIPTION OF EMBODIMENTS

To make the objectives, technical solutions, and advantages of the present invention clearer, the following further describes the present invention in detail with reference to specific embodiments and the accompanying drawings.

Embodiment 1

Figure 2:
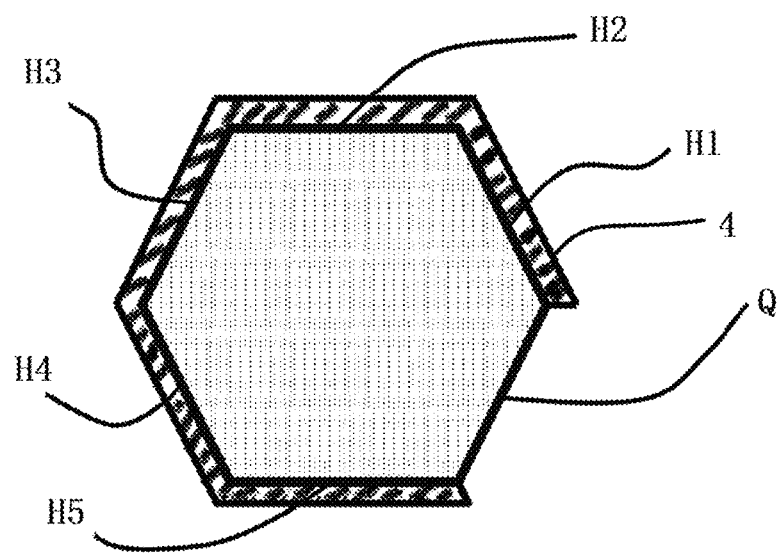
FIG. 2 is a schematic diagram of distributed Bragg reflection layers on surfaces of rear cavities.

As shown in FIG. 1, a laser with a hexagonal semiconductor microdisk includes: a reflecting substrate 1, a hexagonal semiconductor microdisk 2, and a laser 3, where the hexagonal semiconductor microdisk is arranged on the reflecting substrate; emergent light of the laser is perpendicular to a surface of the hexagonal semiconductor microdisk and irradiates any one of six corners of the hexagonal semiconductor microdisk; the laser light in a double-triangular whispering-gallery optical resonance mode horizontally exits from one of the six side walls of the hexagonal semiconductor microdisk, and the side walls of the hexagonal semiconductor microdisk are flat. As shown in FIG. 2, the side wall Q is a front cavity, and the remaining five side walls H1 to H5 are a first rear cavity to a fifth rear cavity respectively; surfaces of the first rear cavity to the fifth rear cavity are provided with distributed Bragg reflection layers 4, and the laser light in the double-triangular whispering-gallery optical resonance mode exits from the front cavity in the six side walls of the hexagonal semiconductor microdisk.

The laser with a hexagonal semiconductor microdisk in the present invention relates to the following specific working principle.

In the present invention, optical excitation is mainly performed on part of the semiconductor microdisk so as to control the output of the laser mode. In laser excitation methods reported in the past, a laser spot completely covers the microdisk. Under this condition, only the hexagonal whispering-gallery mode and the triangular whispering-gallery mode can be excited. In contrast, the semiconductor microdisk of the present invention has a larger diameter, and therefore the light spot of the conventional laser pump source can cover only part of the microdisk. Because of the spatiality of stimulated radiation characteristics, i.e., population inversion occurs only in an excited working substance area and only an optical path in this area is enhanced, when the excitation light spot is located only at a corner of the hexagonal microdisk, resonance occurs only in an optical mode with an optical path under a light spot, and the output laser light is in the double-triangular whispering-gallery optical resonance mode. The optical path in this double-triangular whispering-gallery mode is located at a corner of the hexagonal microdisk, so that the optical mode can be effectively amplified by stimulated radiation.

Figure 4:
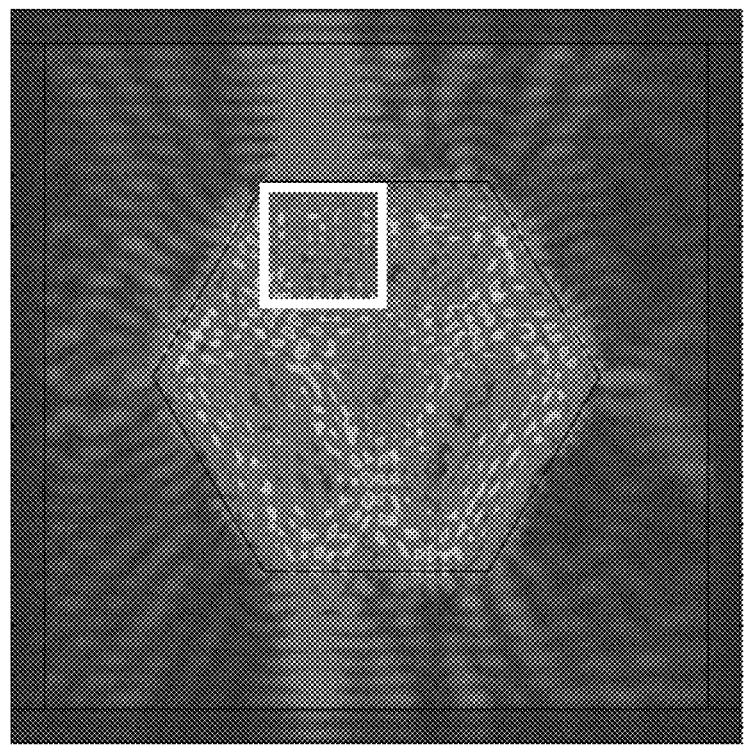
FIG. 4 is a diagram of a simulated light field in a double-triangular whispering-gallery mode.

Based on the formula $$Q = \frac{\pi m n r R^{m/4}}{\lambda(1 - R^{m/2})} \sin\left(\frac{2\pi}{m}\right),$$

where m is the number of reflections, r is the radius of a circumcircle of the hexagon, and R is effective reflectivity, it can be concluded that under the same effective reflectivity, the quality factor of the double-triangular whispering-gallery mode is similar to that of the triangular whispering-gallery mode, but significantly higher than that of the hexagonal whispering-gallery mode. FIG. 4 shows a diagram of a simulated light field in the double-triangular whispering-gallery mode. An excitation area is in a white frame, and a regular hexagon is a semiconductor resonator, with its periphery being air. An outermost frame is a perfect matching layer serving as an absorption layer, and a bright color area in the hexagon is an area with a high light intensity density, i.e., an optical path. In addition, the optical path of the double-triangular whispering-gallery mode is located at a corner of the hexagonal microdisk, and the resonant light in the double-triangular whispering-gallery mode is easier to exit due to an optical diffraction effect of the corner. In addition, the surfaces of the rear cavities are provided with distributed Bragg reflection layers, each of which has a structure obtained by stacking two materials with a large refractive index difference based on a specified thickness and order to form an optical high reflection layer, so that the resonant light in the hexagonal microdisk cannot exit from the surfaces of the five rear cavities. In this way, the laser light is controlled to exit only from the surface of the front cavity, thereby enhancing the emergent intensity and avoiding some troubles in subsequent apparatus application.

Embodiment 2

Figure 7:
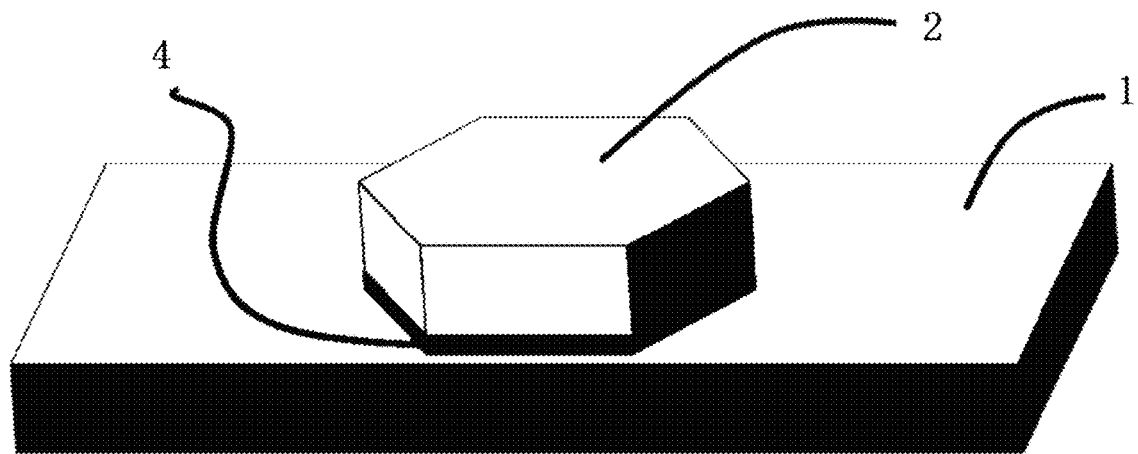
FIG. 7 is a schematic diagram of an arrangement of a distributed Bragg reflection layer between a hexagonal semiconductor microdisk and the reflecting substrate.

A laser with a hexagonal semiconductor microdisk is provided on the basis of Embodiment 1, where the reflecting substrate, the hexagonal semiconductor microdisk and the laser are sequentially configured as a monocrystalline silicon reflecting substrate, a gallium nitride hexagonal microdisk and an ultraviolet pulse laser. The ultraviolet pulse laser has a wavelength of 325 nm, a line width of 100 fs, and a frequency of 1 kHz; a light spot thereof has a diameter of 10 μm; the gallium nitride hexagonal microdisk has a diameter of 25 μm; and an excitation area irradiated on any one of the six corners of the gallium nitride hexagonal microdisk is square. As shown in FIG. 7, a distributed Bragg reflection layer 4 is inserted on a contact interface between the hexagonal microdisk and the substrate.

The function of inserting the distributed Bragg reflection layer on the contact interface between the hexagonal microdisk and the substrate is to effectively prevent the light in the hexagonal microdisk from being lost in the substrate, and effectively reduce the optical loss of the laser, thereby reducing a threshold of the laser and improving performance of the laser.

The excitation area is a specialized term in this field. In this embodiment, the ultraviolet pulse laser irradiates the gallium nitride hexagonal microdisk, and the excitation area is an area in which the ultraviolet pulse laser light excites gallium nitride.

Embodiment 3

Figure 8:
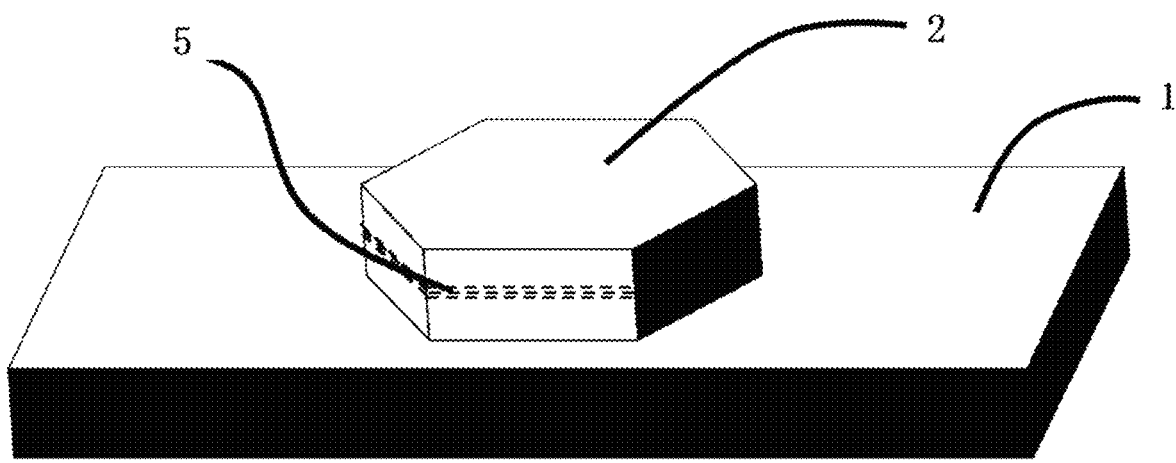
FIG. 8 is a schematic diagram of an arrangement of several layers of quantum well structures in the hexagonal semiconductor microdisk in a cross-sectional direction.

On the basis of Embodiment 1, a laser with a hexagonal semiconductor microdisk is provided. As shown in FIG. 8, several layers of quantum well structures 5 are inserted in the hexagonal microdisk in a cross-sectional direction. The quantum well structures include $Ga_xIn_{(1-x)}N$, $Al_xGa_{(1-x)}N$, $Ga_xIn_{(1-x)}As$, and $Al_xGa_{(1-x)}As$, where $X \in (0, 1)$.

The quantum well structure is usually made of a light-emitting gain material with a nanometer thickness. As an active layer, the quantum well structure can apply the quantum confinement effect to greatly improve quantum luminous efficiency. The quantum confinement effect refers to that the quantization of energy of microscopic particles becomes more obvious as a size of space motion confinement decreases, and changes from a continuous energy band to discrete energy levels. This effect enables electrons and holes to emit light more quickly and efficiently, and improves the luminous intensity. In addition, an emergent wavelength of the laser with a hexagonal microdisk can be effectively controlled by controlling a material of quantum wells, such as the $Ga_xIn_{(1-x)}N$ material, and an energy band width can be controlled by controlling a value of X, i.e., controlling a composition of the Ga element and In element in the material, thereby further controlling a light emission wavelength, which may cover light emission from the ultraviolet band to the near infrared band.

The Comsol Multiphysics simulation software is used to identify conditions the most suitable for light exiting in the double-triangular whispering-gallery mode. A hexagonal resonator model is constructed with its periphery being air, and an edge area is arranged as a perfect matching layer. Electric field excitation is set at the corners of the hexagonal resonator, and an excitation area is square.

By changing the square area of the excitation area, the ratio of the excitation area to the hexagonal area is adjusted. Changes in light field distribution can be observed from light field simulation results, i.e., the optical mode in the hexagonal resonator has changed.

Figure 3:
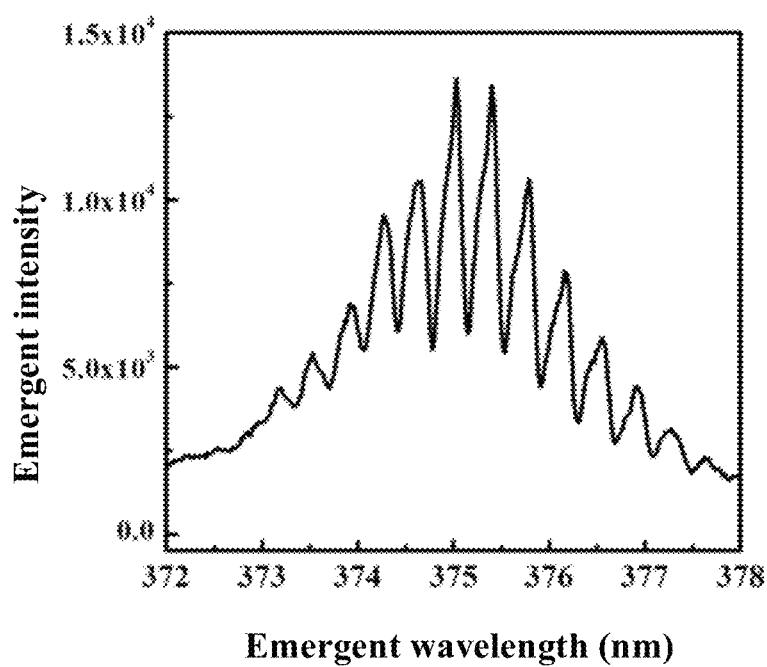
FIG. 3 shows an output spectrum of a gallium nitride laser.
Figure 5:
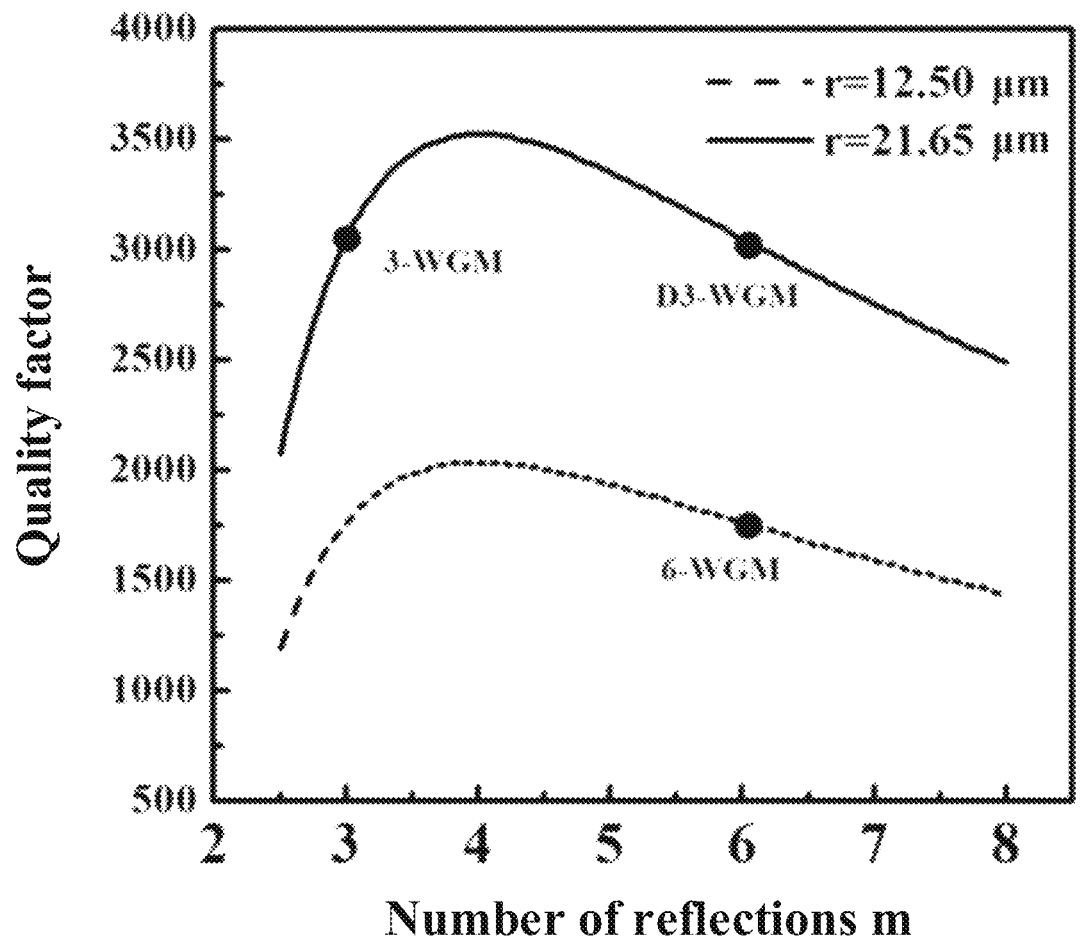
FIG. 5 is a function diagram of the number of reflections and a quality factor of a double-triangular whispering-gallery mode.
Figure 6A:
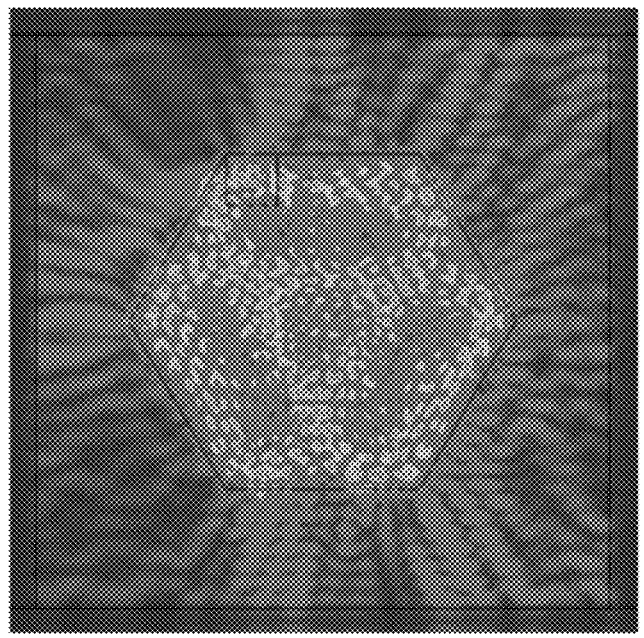
FIG. 6a is a diagram of a simulated light field in which the ratio of an excitation area to a resonator area is 5%.
Figure 6B:
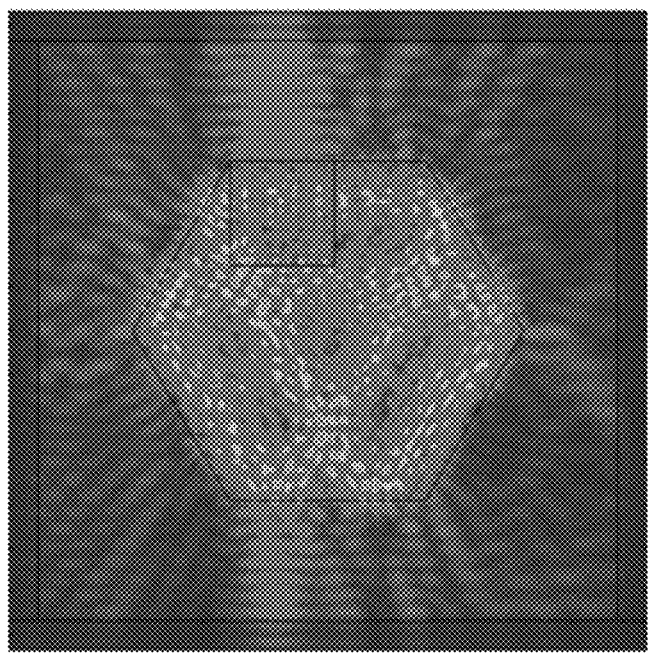
FIG. 6b is a diagram of a simulated light field in which the ratio of an excitation area to a resonator area is 15%.
Figure 6C:
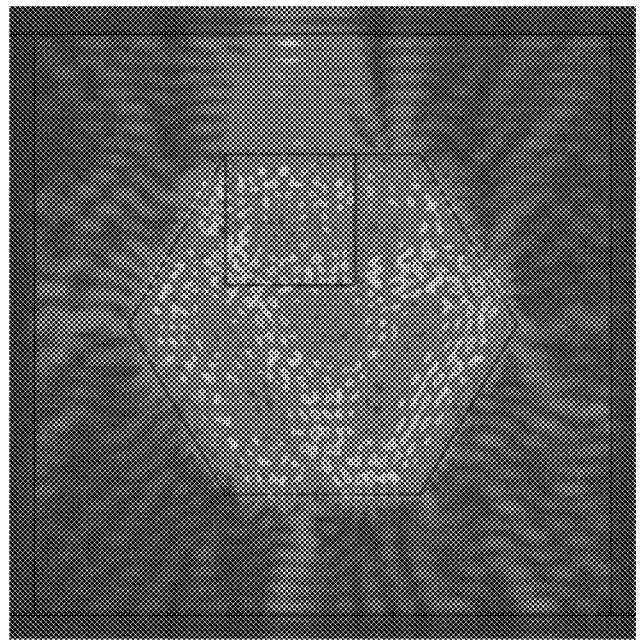
FIG. 6c is a diagram of a simulated light field in which the ratio of an excitation area to a resonator area is 20%.
Figure 6D:
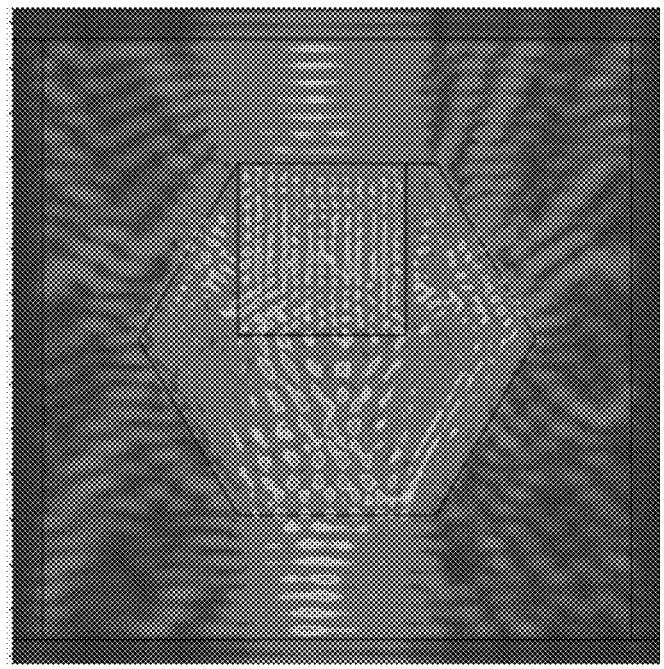
FIG. 6d is a diagram of a simulated light field in which the ratio of an excitation area to a resonator area is 30%.

To verify the effect of the technical solution of the present invention, experimental verification is performed. In the experiment, the ultraviolet pulse laser has a wavelength of 325 nm, a line width of 100 fs, and a frequency of 1 kHz, and a light spot thereof has a diameter of FIG. 2 is a scanning electron microscopy picture of a gallium nitride microdisk. It can be learned that in the experiment, the gallium nitride hexagonal microdisk has a diameter of 25 μm. FIG. 3 shows an output spectrum of a gallium nitride laser. Based on the formula $\Delta\lambda = \lambda^2/[L(n-\lambda dn/d\lambda)]$, where $\lambda$ is an emergent wavelength of the laser with the microdisk, it can be learned from FIG. 3 that, $\lambda$ is about 375 nm, and L is the total length of one cycle of an optical path. It can be learned that, the double-triangular whispering-gallery mode has an interval of 0.35 nm, which is quite close to an experimental result of 0.36 nm, proving that the obtained result is the laser light exiting in the double-triangular whispering-gallery mode. In addition, the quality factor is calculated by using the formula $Q=\lambda/\Delta\lambda$, and an obtained Q value is as high as 3049. FIG. 4 is a diagram of a simulated light field in the double-triangular whispering-gallery mode, which also proves that the laser mode is the double-triangular whispering-gallery mode. FIG. 5 is a function diagram of the number of reflections and a quality factor of the double-triangular whispering-gallery mode. This diagram marks values corresponding to quality factors of the three whispering-gallery modes in the same resonator. It can be learned that, the quality factor corresponding to the double-triangular whispering-gallery mode (D3-WGM) is higher than that of the hexagonal whispering-gallery mode (6-WGM). FIG. 6a to FIG. 6d are diagrams of simulated light fields sequentially corresponding to cases that the ratio of the excitation area to the resonator area is 5%, 15%, 20% and 30%, respectively. It is found from the simulation results that, with regard to the ratio of the excitation area to the hexagonal resonator area, 20% is most suitable for stable and efficient output of laser light in the double-triangular whispering-gallery mode. This is because the double-triangular whispering-gallery mode is gradually destroyed when the area ratio is further increased, as shown in FIG. 6d, and thus an optimal solution can be obtained when the maximum excitation area ratio and the stability of the double-triangular whispering-gallery mode are ensured.

It is also found from the experiment that, the material of the hexagonal semiconductor microdisk is one or more selected from a group consisting of GaN, AlN, GaAs, InAs, ZnO, InP, CdS and perovskite. The laser output in the double-triangular whispering-gallery optical resonance mode can be realized by using this solution, and the quality factor is greatly improved. All the listed materials feature a high refractive index. By using the physical characteristics of stimulated radiation of gain materials with a high refractive index, the reflecting substrate provides light reflection on the bottom surface to reduce an optical loss of a microcavity laser in the vertical direction, and the hexagonal semiconductor microdisk serves as an optical resonator and laser gain material. As an optical pump source, the laser provides an optical gain, and when the power of the pump source exceeds a microcavity laser threshold, generates laser light for exiting. By controlling a laser spot of the pump source to be located at a corner of the hexagonal microdisk, the laser light in the double-triangular whispering-gallery optical resonance mode is generated after stimulated radiation for exiting. Compared with conventional lasers in hexagonal and triangular whispering-gallery optical resonance modes, the present invention has the advantages of a high quality factor and ease of laser exiting.

The above-mentioned specific embodiments further explain the objectives, technical solutions and beneficial effects of the present invention in detail. It should be understood that the above-mentioned descriptions are merely specific embodiments of the present invention, and are not intended to limit the present invention. Any modification, equivalent replacement, improvement, etc. made within the spirit and principles of the present invention should fall within the protection scope of the present invention.

What is claimed is:

1. A laser with a hexagonal semiconductor microdisk, comprising a reflecting substrate, the hexagonal semiconductor microdisk, and the laser, wherein the hexagonal semiconductor microdisk is arranged on the reflecting substrate; emergent light of the laser is perpendicular to a surface of the hexagonal semiconductor microdisk and irradiates any one of six corners of the hexagonal semiconductor microdisk; side walls of the hexagonal semiconductor microdisk are flat, one of the side walls is a front cavity, and the other five side walls are rear cavities; surfaces of the rear cavities are provided with distributed Bragg reflection layers, and laser light in a double-triangular whispering-gallery optical resonance mode exits from the front cavity.

2. The laser with a hexagonal semiconductor microdisk according to claim 1, wherein a distributed Bragg reflection layer is also arranged between the hexagonal semiconductor microdisk and the reflecting substrate.

3. The laser with a hexagonal semiconductor microdisk according to claim 1, wherein several layers of quantum well structures are arranged in the hexagonal semiconductor microdisk in a cross-sectional direction.

4. The laser with a hexagonal semiconductor microdisk according to claim 3, wherein the quantum well structures comprise $Ga_XIn_{(1-X)}N$, $Al_XGa_{(1-X)}N$, $Ga_XIn_{(1-X)}As$, and $Al_XGa_{(1-X)}As$, wherein $X \in (0, 1)$.

* * * * *